United States Patent [19]

Balchunas

[11] 4,313,085

[45] Jan. 26, 1982

[54] APPARATUS FOR DETECTING ADJACENT INSULATION FAULTS IN TWO OR MORE WIRES

[75] Inventor: William C. Balchunas, Mendham, N.J.

[73] Assignee: Western Electric Company, Inc., New York, N.Y.

[21] Appl. No.: 80,611

[22] Filed: Oct. 1, 1979

[51] Int. Cl.³ ............................................. G01R 31/14
[52] U.S. Cl. ................................................... 324/54
[58] Field of Search ........................................ 324/54

[56] References Cited

U.S. PATENT DOCUMENTS

| | | | |
|---|---|---|---|
| 2,994,820 | 8/1961 | Brown | 324/54 |
| 3,287,633 | 11/1966 | Mollo | 324/54 X |
| 3,323,701 | 6/1967 | Gurski et al. | 324/54 X |
| 3,491,290 | 1/1970 | Peschel | 324/54 |
| 3,548,302 | 12/1970 | Arnold et al. | 324/54 |
| 3,617,122 | 10/1971 | Pahl | 324/54 |
| 3,763,426 | 10/1973 | Wilkes | 324/54 |
| 3,789,295 | 1/1974 | Balchunas et al. | 324/54 |
| 3,823,370 | 7/1974 | Pendleton et al. | 324/54 |
| 4,056,771 | 11/1977 | Clinton et al. | 324/54 |

FOREIGN PATENT DOCUMENTS 1016210  1/1966  United Kingdom ................. 324/54

Primary Examiner—Gerard R. Strecker
Attorney, Agent, or Firm—Robert B. Kennedy

[57] ABSTRACT

A method and apparatus is disclosed for detecting insulation faults in the insulation of wires being stranded into cable. A voltage is applied to a bead-chain electrode through which the wires are passed, a signal pulse generated upon voltage breaking down between the electrode and a wire, and the simultaneous presence of signal pulses in two or more wires detected. In this manner adjacent insulation faults in two or more wires may be recognized.

1 Claim, 3 Drawing Figures

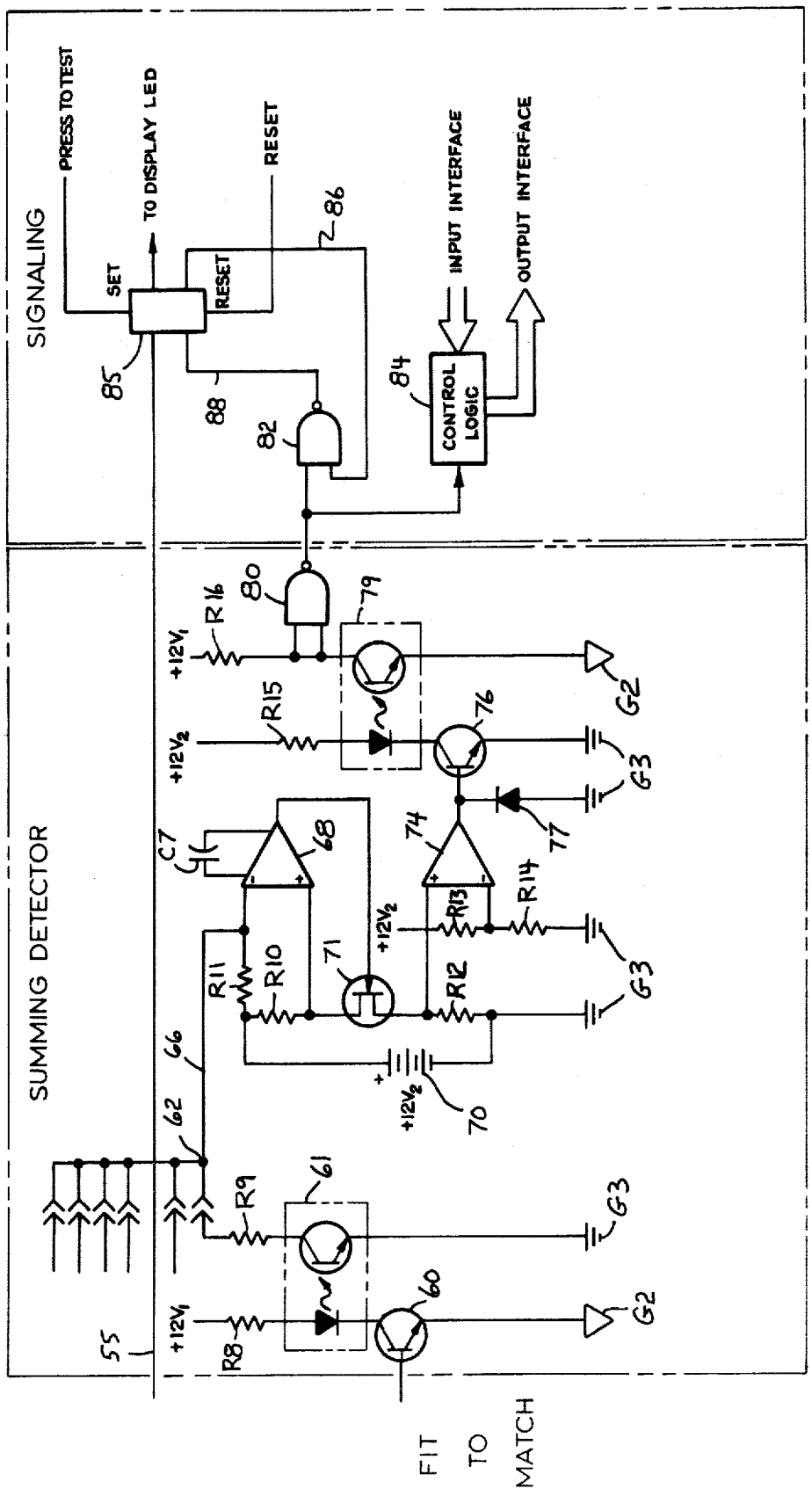

4,313,085

APPARATUS FOR DETECTING ADJACENT INSULATION FAULTS IN TWO OR MORE WIRES

TECHNICAL FIELD

This invention relates to methods and apparatuses for detecting insulation faults in wires as they are being stranded into cable.

BACKGROUND OF THE INVENTION

Heretofore, apparatuses have been devised for detecting faults in the insulation of electrical conductors or wires such as those used in telecommunications. U.S. Pat. No. 3,491,290, for example, discloses electrical circuit means for recognizing two or more closely adjacent insulation faults in a single wire. U.S. Pat. No. 3,548,302 teaches apparatus for detecting bare portions of insulated wire that exceed a selected size or number for a given wire length. U.S. Pat. No. 3,823,370 discloses a circuit for counting detected faults in the insulation of a wire and for actuating an alarm when the fault rate exceeds a selected number for a given length of wire. It thus is seen that the state of the art has now reached a significant degree of sophistication and maturity.

When a group of insulated wires are used in close proximity, such as where they are being stranded into a cable, the information concerning the integrity of insulation about individual wires, though available in detail, can still be insufficient or at least not as meaningful as is actually needed. For example, were the insulation about one wire in a cable is faulty while the insulation about the other wires stranded thereabout is not faulty, the electrical properties of the cable may remain unimpaired. This is because the insulation about the remaining conductors in proximity with the fault prevents any short circuiting between wires. Thus, if only information concerning the integrity of the individual wires is available cable may be declared unacceptable when in fact it is functionally sound. Furthermore, cable fault testing has heretofore usually been performed after stranding at a test station remote from the manufacturing line. Such off-line testing is quite burdensome and fails to permit on-line fault marking and repair. It therefore would be desirable to devise an apparatus and method for detecting the presence of adjacent faults in the insulation about a set of wires as they are being stranded into a cable of the fault type likely to lead to a functional impairment of the cable. It is this task to which the present invention is primarily directed.

SUMMARY OF THE INVENTION

In one preferred form of the invention a method is provided for detecting the presence of adjacent faults in the insulation about wires being stranded into a cable. The method comprises the steps of establishing a voltage across an electrode and an uninsulated portion of each wire, moving the insulated wires closely past the electrode whereby a train of voltage spikes may be transmitted through a wire whenever an insulation fault on that wire moves past the electrode and causes a voltage breakdown between the electrode and wire, generating a signal pulse of a selected duration upon the detection of a spike in the train of spikes transmitted through a wire, and detecting the simultaneous presence of at least a portion of signal pulses generated by the transmission of voltage spikes through two or more wires.

In another preferred form of the invention apparatus is provided for detecting the presence of adjacent faults in the insulation about wires being stranded into a cable. The apparatus comprises means for establishing a voltage across an uninsulated end portion of each wire and an electrode by which the wires may be passed, and means for detecting a train of voltage spikes being transmitted through a wire whenever an insulation fault on that wire moves past the electrode and causes a voltage breakdown between the electrode and wire. Further provided are means for generating a signal pulse of a selected duration upon the detection of a spike in the train of spikes transmitted through a wire and means for detecting the simultaneous presence of at least a portion of signal pulses generated by the transmission of voltage spikes through two or more wires.

BRIEF DESCRIPTION OF THE DRAWINGS

FIGS. 2a and 2b provide a circuit diagram of apparatus for detecting the presence of adjacent faults in the insulation about wires being stranded into cable as depicted in FIG. 1 which circuit may be employed in practicing a method of the invention.

DETAILED DESCRIPTION

Figure 1:
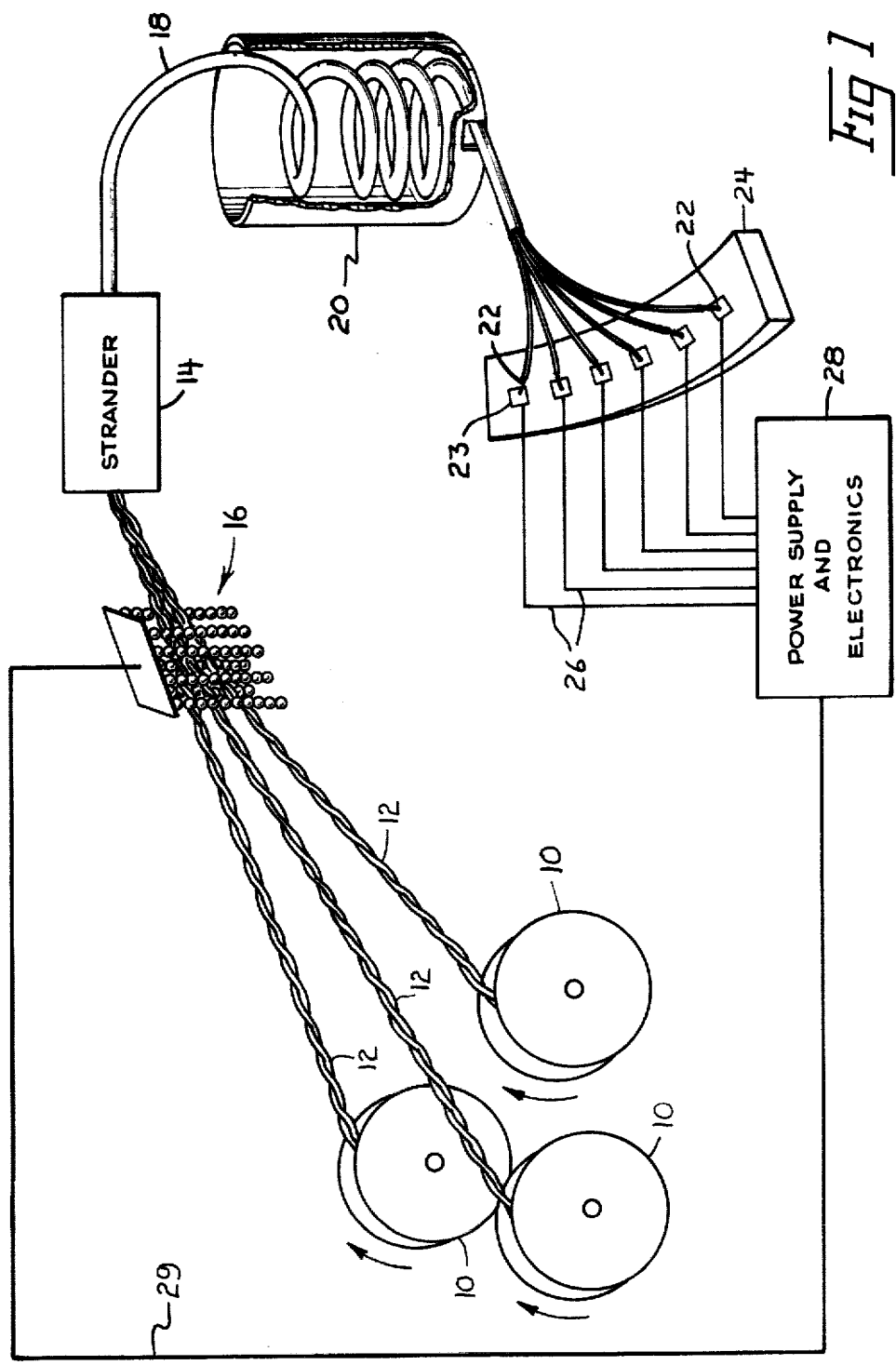
FIG. 1 is a schematic diagram of wires being stranded into cable while being tested for insulation faults in accordance with the present invention.

Referring now in more detail to the drawing, there is shown in FIG. 1 three supply reels 10 from which twisted pairs of insulated telecommunications wire 12 are sent to a strander 14 through a bead-chain type electrode 16. The pairs of wires are stranded into a cable 18 by the strander and taken up in a stationary takeup barrel 20 with uninsulated end portions 22 of each wire connected to a terminal 23 of a fanning fixture 24. Each terminal 23 is in turn coupled by conductors 26 to a power supply and electronics unit 28 as is the bead-chain electrode 16 by means of a conductor 29. The supply reels, strander, bead-chain electrode, and fanning fixture may be of conventional structure or may be comprised of that specific apparatus disclosed in copending patent application Ser. No. 63,009, filed Aug. 2, 1979, by B. C. Ellis, Jr. titled "Methods of and Apparatus for Making Cable and Product Produced Thereby", which is assigned to the assignee of the present invention. A detailed example of the stationary takeup barrel may also be had by reference to that application.

Figure 2A:
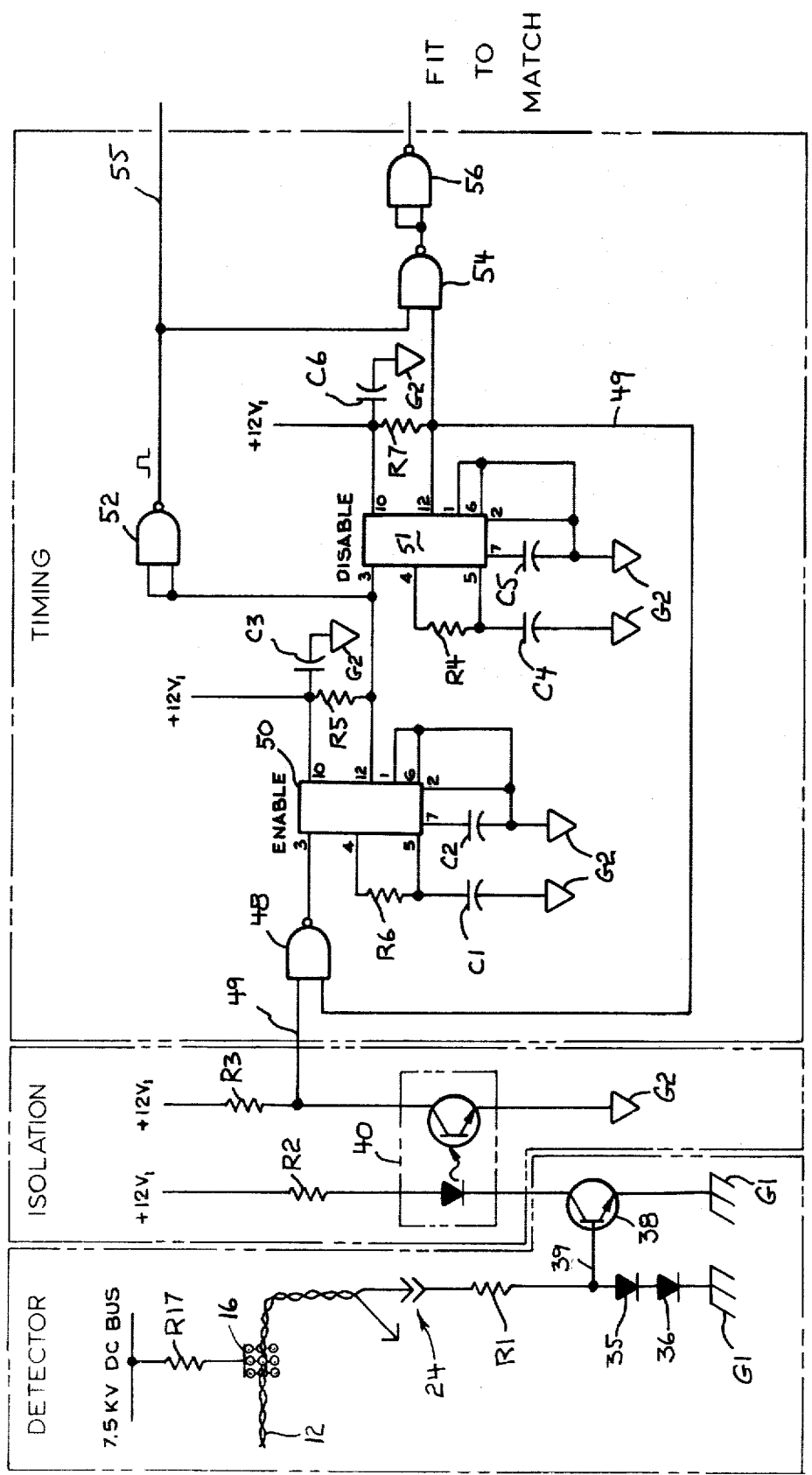

The power supply and electronics unit or circuitry 28 is illustrated in detail in FIG. 2. Here the bead-chain electrode 16 through which the twisted wire pairs 12 are passed is connected to a 7.5 KVDC bus through a current limiting and arc suppressing resistor R17 in a detector section of the curcuit. Each wire in the pairs of wires is connected via the fanning fixture 24 to a common high voltage test ground G1 through a resistor R1 and two diodes 35 and 36. This circuit is connected by a branch conductor 39 to the base of a transistor 38 having an emitter coupled with ground and a collector connected to an optical isolator 40 in an isolation section of the circuitry. The optical isolator 40 has a light emitting diode in series circuit with a +12 volt power supply through a resistor R2. The light emitting diode is optically coupled with a phototransistor and has its collector also connected with a +12 volt source of power through a resistor R3 and its emitter connected to a common logic ground G2.

The output from the isolation portion of the circuit is coupled with a timing section of the power supply and electronics circuitry and in particular to an input terminal of a logic NAND gate 48 by conductor 49. The output of the NAND gate is coupled with pin 3 of a type LM322N integrated circuit (IC) 50 that performs an enable timing function. Pin 4 of the IC is connected to pin 5 through resistor R6 while pin 5 itself is coupled to ground G2 through capacitor C1. Pins 1, 2 and 6 are connected also directly to ground G2 while pin 7 is connected to ground through capacitor C2. Pin 10 is connected to a +12 volt DC source of power and to ground G2 through capacitor C3 and also to pin 12 through a resistor R5. Pin 12 is connected to both input terminals of a NAND gate 52 and also to pin 3 of another type LM322N integrated circuit 51 that performs a disabling timing function. This IC also has its pin 4 connected to pin 5 through a resistor R4 and its pin 5 connected to ground G2 through a capacitor C4. Pins 1, 2 and 6 here are connected directly to ground G2 while pin 7 is connected to ground through a capacitor C5. Pin 12 is coupled with a +12 volt DC power supply and to pin 10 through resistor R7. Pin 10 is also connected to ground G2 through a capacitor C6 while pin 12 is connected to one input terminal of still another NAND gate 54 having its other input terminal connected with output terminal of NAND gate 52.

The output of the NAND gate 54 is connected to both inputs of yet another NAND gate 56 while the output of NAND gate 52 is connected with the signaling section of the circuitry. The output of NAND gate 56 in the timing portion of the circuit is fed as an input signal into a summing and coincidence detector portion and, in particular, to the base of a transistor 60. The collector of the transistor 60 is connected to an optical isolator 61 and to a +12 volt DC voltage supply through resistor R8 while its emitter is connected to ground G2. The collector of the phototransistor component of the optical isolator 61 is connected to a load resistor R9 and to a summing point 62 while the emitter is connected to ground G3.

At the summing point 62 are connected the input signal lines from identical circuitry as heretofore described for each of the other wires in the various pairs 12 that are passed through the bead-chain electrode 16 in being stranded into cable 18. This summing point 62 is in turn connected by conductor 66 to the negative input terminal of an operational amplifier 68 which terminal is connected through resistor R11 to the positive terminal of a 12 volt battery 70 and to the positive terminal of the amplifier through another resistor R10. The positive input terminal of the amplifier 68 is connected to the negative terminal of battery 70 and to ground G3 through a field effect transistor 71 and a resistor R12. The output of the amplifier is coupled with the gate of the field effect transistor 71 and with its own positive terminal through capacitor C7.

The field effect transistor is also coupled with the positive input terminal of another operational amplifier 74 having its negative input terminal connected to ground G3 through a resistor R14 and also to a 12 volt source of power through another resistor R13. The output terminal of the operational amplifier 74 is connected both to the base of the transistor 76 and to ground G3 through a diode 77. The collector of transistor 76 is connected to a light emitting diode component of another optical isolator 79 and to a 12 volt power supply through resistor R15 while the transistor emitter is grounded. The collector of the phototransistor component of the optical isolator 79 is connected to a 12 volt power supply through resistor R16 while its emitter is connected to ground G2. The collector of the phototransistor is also connected to both input terminals of a NAND gate 80 whose output terminal is connected to the signaling portion of the circuitry.

The signaling portion of the circuit includes a NAND gate 82 having an input terminal connected to the NAND gate 80 and also to control logic circuitry 84. The other input terminal of the NAND gate 82 is connected to a flip-flop 85 by conductor 86. Its output is also connected to the flip-flop by conductor 88. The output of the flip-flop is connected to a conventional display light emitting diode and to a "press to test" switch and to a reset switch.

One exemplary set of values for the resistors and capacitors of the circuit of FIG. 2 are listed in the following table:

TABLE 1

| Component | Value |
|---|---|
| R1 | 130 ohms |
| R2 | 1K ohms |
| R3 | 10K ohms |
| R4 | 309K ohms |
| R5 | 10K ohms |
| R6 | 102K ohms |
| R7 | 10K ohms |
| R8 | 1K ohms |
| R9 | 1K ohms |
| R10 | 10 ohms |
| R11 | 1 ohms |
| R12 | 2K ohms |
| R13 | 1600 ohms |
| R14 | 1600 ohms |
| R15 | 1K ohms |
| R16 | 10K ohms |
| R17 | 700K ohms |
| C1 | .039 microfarads |
| C2 | .1 microfarads |
| C3 | .1 microfarads |
| C4 | .1 microfarads |
| C5 | .1 microfarads |
| C6 | .1 microfarads |
| C7 | 33 picafarads |

In operation the pairs of wires 12 are fed at a selective velocity through the bead-chain electrode 16 of a finite length whereby the time is determinable for which any point of the wires is in contact with the electrode. The pairs of wires are then stranded into cable 18 by the strander 14 and collected in barrel 20. During this time a conductive end 22 of each wire is connected to the fanning fixture 24 and to the power supply and electronics circuitry just described.

As the insulated wires pass through the bead-chain electrode high voltage is applied to them which is current limited and arc suppressed by the resistor R17. If a fault in the insulation about a wire is sufficient to cause a voltage breakdown voltage spikes are conducted through that wire and the fanning fixture 24 to ground G1. Resistor R1, diodes 35 and 36, and transistor 38 thereupon function as a voltage spike threshold level detector whereby upon a threshold voltage spike being transmitted to the base of the transistor 38, the transistor is switched on causing the optical isolator to emit a signal over conductor 49 to the timing portion of the circuitry. Thus the current limiting resistors R2 and R3, the optical isolator 40, and the 12 volt power supply serve to transform a detected voltage spike into an electrically isolated logic level signal that is fed to logic gate 48 in the timing portion of the circuitry via conductor 49. If this logic gate is enabled allowing a signal change at its output a detected spike signal is thus transmitted to trigger the timer enable I.C. 50. The characteristics of the pulse then generated is dependent upon the timing components, resistors R5 and R6, capacitors C1, C2 and C3, and the power supply.

The output of the enable timer is fed to an inversion logic gate provided by NAND gate 52 and into the input of a disable timer I.C. 51 and its associated timing components resistors R4 and R7 capacitors C4, C5 and C6 and a 12 volt power supply. The enable and disable timers are thereby so interrelated that a pulse of predetermined length is initiated by the disable timer upon the sensing of a threshold voltage spike. This pulse length is made proportional to the effective length of the bead-chain electrode and the speed of the wire pairs to normalize breakdown faults times so that they may be later compared for mutual spacing within a finite distance of one another. This pulse is outputted from the logic NAND gate 54, inverted by the NAND gate 56, and electrically isolated and transmitted by transistor 60, optical isolator 61, resistors R8 and R9, and the power supply. When gated the collector of the phototransistor component of optical isolator 61 draws a selected amount of current from battery 70 through conductor 66. If any other phtotransistor in the duplicate circuitry associated with other wires in pairs 12 is also gated it too draws current in parallel from the battery since it collector is connected at summing point 62. In this manner the summing and coincidence detector portion of the circuitry reflects the current drawn from the 12 volt battery 70 as a proportional voltage across the resistor R12. Since the load resistors R9 are identical in the circuits associated with each pair of wire pairs 12 and summed at the summing point 62, the voltage across resistor R12 is indicative of the number of insulated wires that have broken down within a common time frame. By feeding this voltage into the operational amplifier 74 for comparison, the output of the operational amplifier 74 indicates whenever two or more faults in different wires have occured within the common time frame. In doing this the diode 77 here acts as a clipper to the transistor 76 which provides switching capability to optical isolator 79 by the current limiting resistors R15 and R16 and the power supplies. The logic gate 80 then provides inversion and interfacing to the signaling portion of the circuit and to the test set control logic circuitry 84.

During this time the logic gate 52 back in the timing section feeds the flip-flop 85 by conductor 89 to indicate which conductors that have broken down. The logic gate 80 propagates coincidence fault data through the NAND gate 82 to lock on the display LED. In that case all lights faulted at the same time are activated until cleared by the operator.

To recapitulate briefly, the detector section detects a voltage threshold by gating transistor 38. The isolation section isolates the high voltage and transmits a logic level signal into the timing circuitry. The enable and disable integrated circuits within the timing circuitry with their associated discrete components provide a time frame, such as in terms of milliseconds, whereby a pulse of a selected duration is emitted into the summing and coincidence detector section of the circuitry. In selecting a time frame the velocity of the wire pairs and the width of the bead-chain electrode is taken into account. Within this section an operational amplifier detects a voltage level indicative of coincidence of two or more pulses within a selected time frame from two or more wires being tested and causes a signal to be transmitted to the signaling portion. If any portion of two pulses of the selected duration are real time coincident a signal is emitted by the signaling section to an operator. The operator is in this manner made to realize that two faults are present in two different and identified conductors spaced sufficiently close together to present a danger of short circuiting.

It should be understood that the just described embodiment merely illustrates principles of the invention in one preferred form. Many modifications, additions, and deletions may, of course, be made thereto without departure from the spirit and scope of the invention as set forth in the following claims.

I claim:

1. Apparatus for detecting the presence of adjacent faults in the insulation about wires being stranded into a cable comprising means for establishing a voltage across an uninsulated end portion of each wire and an electrode by which the wires may be passed; means for detecting a train of voltage spikes being transmitted through a wire whenever an insulation fault on that wire moves past the electrode and causes a voltage breakdown between the electrode and wire; means for generating a signal pulse upon the detection of said spike train detecting means of a spike in the train of spikes transmitted through a wire of a selected duration independent of and unextendable by subsequent spikes in said train; and means for detecting the simultaneous presence of at least a portion of at least two signal pulses generated by said signal pulse generating means upon the transmission of voltage spikes through two or more wires; and wherein said means for detecting a train of voltage spikes comprises a transistor having a gate coupled with an uninsulated end portion of a wire, and a phototransistor having lamp means coupled with the base of said transistor and a base coupled with a logic gate, whereby the phototransistor may transmit a logic signal to the logic gate upon being actuated by the transistor in response to a transistor gating voltage spike appearing in a wire, and wherein said signal pulse generating means comprises first means for generating first logic signal at the termination of a time interval commencing upon detection of a voltage spike by said spike train detecting means, and second means coupled with said first means for generating and transmitting a second logic signal to said logic gate at the termination of a time interval commencing upon receipt of a signal from said first means.

* * * * *